United States Patent
Imuta

(10) Patent No.: US 8,559,137 B2
(45) Date of Patent: Oct. 15, 2013

(54) PIEZOELECTRIC ACTUATOR AND HEAD SUSPENSION

(75) Inventor: Shogo Imuta, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 0 days.

(21) Appl. No.: 13/228,146

(22) Filed: Sep. 8, 2011

(65) Prior Publication Data
US 2012/0087047 A1    Apr. 12, 2012

(30) Foreign Application Priority Data
Oct. 7, 2010   (JP) .................................. 2010-227352

(51) Int. Cl.
*G11B 5/56* (2006.01)
*G11B 21/24* (2006.01)

(52) U.S. Cl.
USPC ....................................................... 360/294.4

(58) Field of Classification Search
USPC .................. 360/294.4; 310/311, 323.17, 348; 347/68, 70
See application file for complete search history.

(56) References Cited

U.S. PATENT DOCUMENTS

| | | | |
|---|---|---|---|
| 6,487,055 B1 * | 11/2002 | Mei .............................. | 360/294.4 |
| 6,597,541 B2 * | 7/2003 | Nishida et al. ............. | 360/294.4 |
| 6,661,618 B2 * | 12/2003 | Fujiwara et al. ........... | 360/294.4 |
| 6,791,802 B2 * | 9/2004 | Watanabe et al. .......... | 360/294.4 |
| 7,130,159 B2 * | 10/2006 | Shimizu et al. ............. | 360/294.4 |
| 7,417,830 B1 * | 8/2008 | Kulangara ................... | 360/294.4 |
| 8,144,436 B2 * | 3/2012 | Iriuchijima et al. ........ | 360/294.4 |
| 8,248,735 B2 * | 8/2012 | Fujimoto et al. ........... | 360/294.4 |
| 8,331,061 B2 * | 12/2012 | Hanya et al. ................ | 360/294.4 |
| 8,335,055 B2 * | 12/2012 | Hanya et al. ................ | 360/294.4 |
| 2002/0075606 A1 * | 6/2002 | Nishida et al. ............. | 360/294.4 |
| 2009/0080117 A1 * | 3/2009 | Shimizu et al. ............. | 360/294.4 |
| 2010/0296196 A1 * | 11/2010 | Iriuchijima et al. ........ | 360/246.1 |
| 2011/0058282 A1 * | 3/2011 | Fujimoto et al. ........... | 360/246.2 |
| 2012/0091857 A1 * | 4/2012 | Ikeji et al. ................. | 310/323.17 |

FOREIGN PATENT DOCUMENTS

JP    2002-184140    6/2002

* cited by examiner

*Primary Examiner* — Will J Klimowicz
(74) *Attorney, Agent, or Firm* — Jordan and Hamburg LLP

(57) ABSTRACT

A piezoelectric actuator includes an actuator base that supports a load beam and has an opening accommodating a piezoelectric element, a receiver member that is laid on and fixed to the actuator base and forms a receiver that faces the opening and receives the piezoelectric element, an adhesive part formed of a liquid adhesive that is filled in a space defined by the piezoelectric element, an inner circumference of the opening, and the receiver and adheres the piezoelectric element to the inner circumference of the opening and the receiver, and a suppressing zone that is formed along an overlapping area where the actuator base and receiver member overlap each other and suppresses penetration of the liquid adhesive due to a capillary phenomenon into the overlapping area.

6 Claims, 7 Drawing Sheets

PIEZOELECTRIC ACTUATOR AND HEAD SUSPENSION

BACKGROUND OF THE INVENTION

1. Field of the Invention

The present invention relates to a piezoelectric actuator having a piezoelectric element that deforms in response to a voltage applied thereto and thereby displaces an object supported by the piezoelectric actuator and to a head suspension employing the piezoelectric actuator.

2. Description of Related Art

Small-sized, precision information devices are rapidly advancing, and for use with such devices, needs for micro-actuators capable of conducting positioning control for very small distances are increasing. The micro-actuators are highly needed by, for example, optical systems for correcting focuses and inclination angles, ink-jet printers for controlling ink heads, and magnetic disk drives for controlling magnetic heads.

The magnetic disk drives increase storage capacity by increasing the number of tracks per inch (TPI), i.e., by narrowing the width of each track on a magnetic disk.

Large-capacity magnetic disk drives, therefore, need an actuator capable of precisely positioning the magnetic head within a minute range across tracks.

To meet the need, Japanese Unexamined Patent Application Publication No. 2002-184140 discloses a head suspension employing a dual actuator system. The dual actuator system uses a piezoelectric element in addition to a usual voice coil motor that drives a carriage to which the head suspension is attached. The piezoelectric element is arranged between a base plate and a load beam of the head suspension, to minutely move a magnetic head attached to a front end of the load beam.

According to this related art, the voice coil motor turns the head suspension through the carriage, and in addition, the piezoelectric element deforms in proportion to a voltage applied thereto, to minutely move the magnetic head at the front end of the load beam in a sway direction (a width direction of the load beam) relative to the base plate. The dual actuator system involving the voice coil motor and piezoelectric element is capable of precisely positioning the magnetic head to a target position on a magnetic disk.

The head suspension with the dual actuator system employs an actuator base for fitting the piezoelectric element to the head suspension.

The actuator base generally has an opening to accommodate the piezoelectric element and a receiver arranged at the opening and supporting the piezoelectric element. The piezoelectric element is set in the opening and a liquid adhesive is applied and solidified between the piezoelectric element and the receiver and inner circumference of the opening, thereby fixing the piezoelectric element to the actuator base.

When attaching the piezoelectric element to the actuator base, the piezoelectric element is positioned with respect to a thickness-direction center line in the opening of the actuator base. The receiver to receive the piezoelectric element at the opening is formed by laying a discrete receiver member on the actuator base. The receiver member is arranged outside the opening.

This configuration frequently creates small gaps in an overlapping area where the actuator base and receiver member are laid one on another. These gaps draw a liquid adhesive before solidification due to a capillary phenomenon.

If the liquid adhesive is made of a base adhesive and hardening particles, only the base adhesive will penetrate the gaps and the penetrated base adhesive will not solidify. Even if it solidifies, the adhesive in the overlapping area affects the dynamic characteristics such as resonance and windage characteristics of the head suspension.

SUMMARY OF THE INVENTION

An object of the present invention is to provide a piezoelectric actuator capable of preventing a liquid adhesive from penetrating between an actuator base and a receiver member.

In order to accomplish the object, an aspect of the present invention provides a piezoelectric actuator having a piezoelectric element that deforms according to a voltage applied thereto and thereby displaces an object supported by the piezoelectric actuator. The piezoelectric actuator includes an actuator base supporting the object and having an opening that accommodates the piezoelectric element, a receiver member laid on and fixed to the actuator base to form a receiver that faces the opening and receives the piezoelectric element, an adhesive part formed of a liquid adhesive that is filled in a space defined by the piezoelectric element, an inner circumference of the opening, and the receiver and adheres the piezoelectric element to the inner circumference of the opening and the receiver, and a suppressing zone formed along an overlapping area where the actuator base and receiver member overlap each other and suppresses penetration of the liquid adhesive due to a capillary phenomenon into the overlapping area.

According to this aspect of the present invention, the suppressing zone suppresses penetration of the liquid adhesive due to a capillary phenomenon into the overlapping area.

DETAILED DESCRIPTION OF EMBODIMENTS

Embodiments of the present invention will be explained in detail with reference to the drawings. Each embodiment forms a suppressing zone at an overlapping area where an actuator base and a receiver member overlap each other, to suppress penetration of a liquid adhesive due to a capillary phenomenon into the overlapping area.

Figure 1:
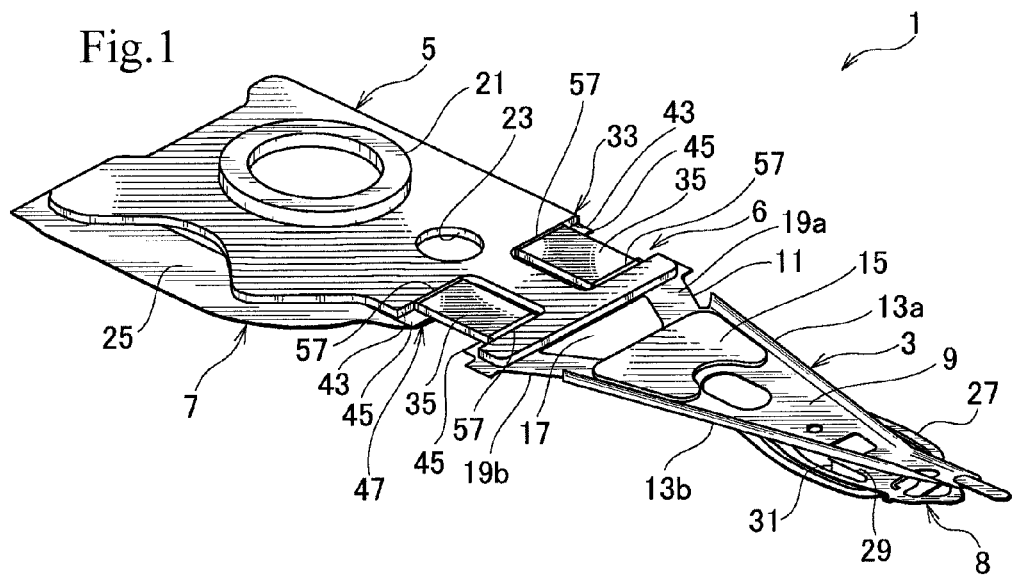
FIG. 1 is a perspective view illustrating a head suspension employing a piezoelectric actuator according to a first embodiment of the present invention.
Figure 2:
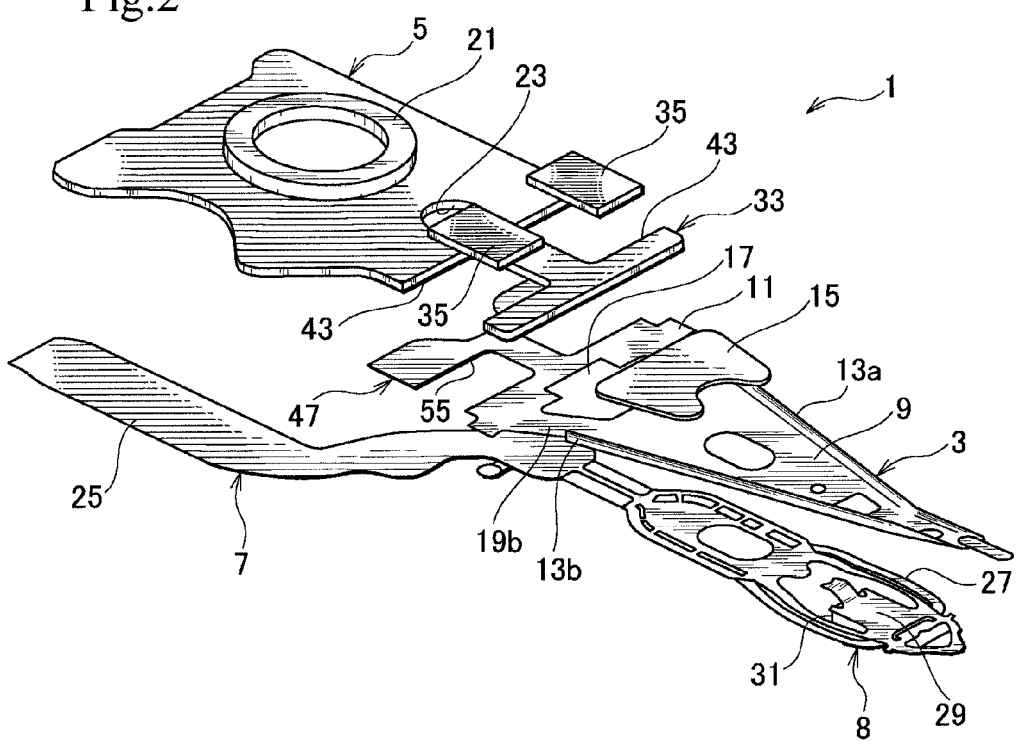
FIG. 2 is an exploded perspective view illustrating the head suspension of FIG. 1.

FIG. 1 is a perspective view illustrating a head suspension 1 employing a piezoelectric actuator 6 according to the first embodiment of the present invention and FIG. 2 is an exploded perspective view illustrating the head suspension 1.

As illustrated in FIGS. 1 and 2, the head suspension 1 has a load beam 3 corresponding to an object supported by the piezoelectric actuator 6, a base plate 5 corresponding to a base of the head suspension 1, the piezoelectric actuator 6, and a flexure 7.

The load beam 3 applies load onto a read/write head 8 and includes a rigid part 9 and a resilient part 11. The rigid part 9 is made of, for example, a resilient stainless steel thin plate having a thickness in the range of about 30 to 150 μm.

Along each edge of the rigid part 9, bends 13a and 13b rise and extend from a front end to a base end of the rigid part 9, to improve the rigidity of the rigid part 9. The base end of the rigid part 9 is provided with a damper 15 and is integral with the resilient part 11.

The resilient part 11 has a through window 17 and legs 19a and 19b formed on each side of the window 17. The resilient part 11 may separately be formed from the rigid part 9 and may be fixed to the rigid part 9 by, for example, laser welding.

The base plate 5 supports the load beam 3 that supports the head 8. The base plate 5 is made of, for example, a stainless steel thin plate having a thickness in the range of about 150 to 200 μm.

The base plate 5 has a circular boss 21. With the boss 21, the base plate 5 is attached to a carriage (not illustrated) that is turned by a voice coil motor (not illustrated). The base plate 5 may have a reinforcing plate that is laid on and fixed to the base plate 5.

A front end of the base plate 5 has a cut 23. At the frond end, the base plate 5 supports the load beam 3 through the piezoelectric actuator 6. The details of the piezoelectric actuator 6 will be explained later.

The flexure 7 includes a conductive substrate 25 made of for example, a resilient stainless steel (SST) thin rolled plate, an insulating layer formed on the substrate 25, and wiring 27 formed on the insulating layer. The substrate 25 has a thickness in the range of about 10 to 25 μm.

The flexure 7 is fixed to the load beam 3 by, for example, laser welding. A front end of the flexure 7 has a tongue 29 in the form of a cantilever. The tongue 29 supports a slider 31 of the head 8 to which an end of the wiring 27 is electrically connected.

Figure 3:
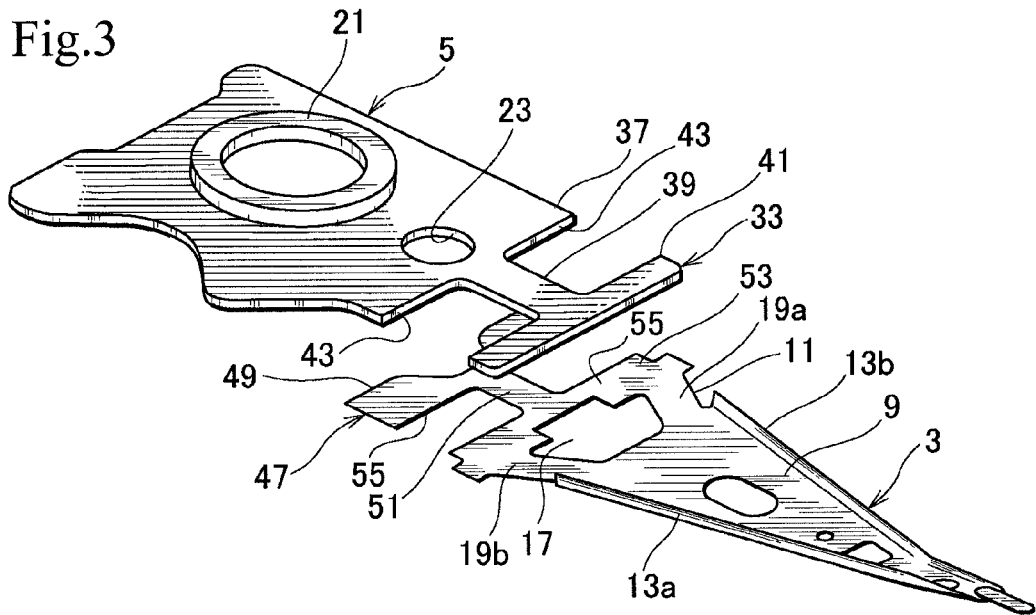
FIG. 3 is an exploded view illustrating a base plate and load beam of the head suspension of FIG. 2.
Figure 4:
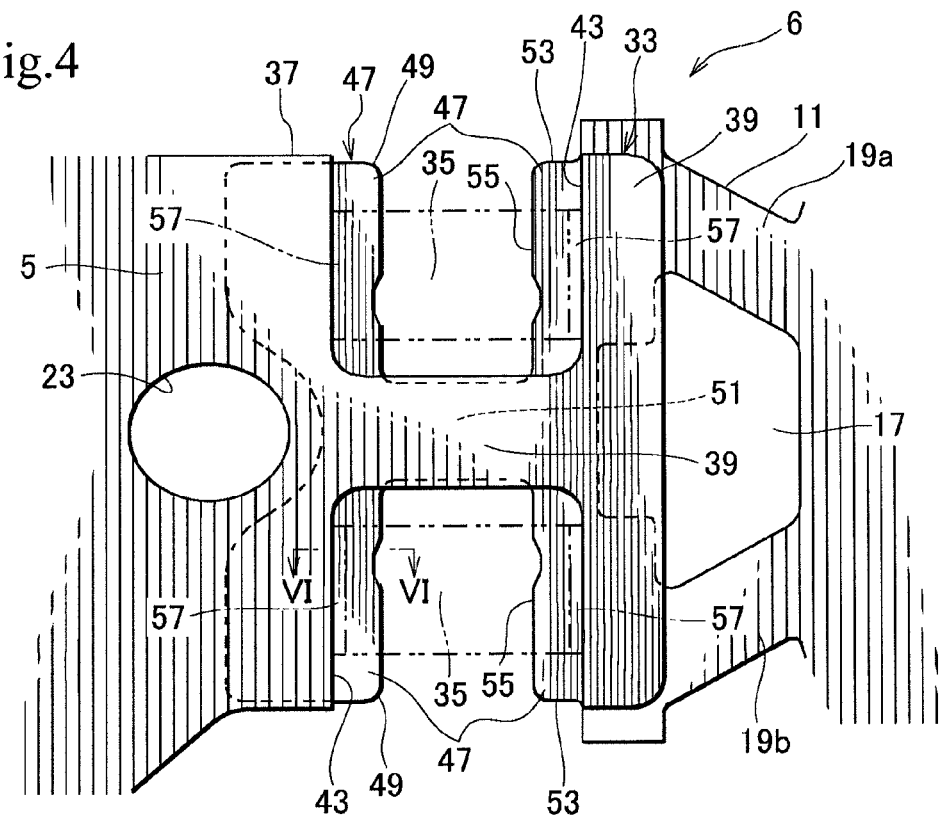
FIG. 4 is a partial plan view illustrating a piezoelectric actuator of the head suspension of FIG. 1.
Figure 5:
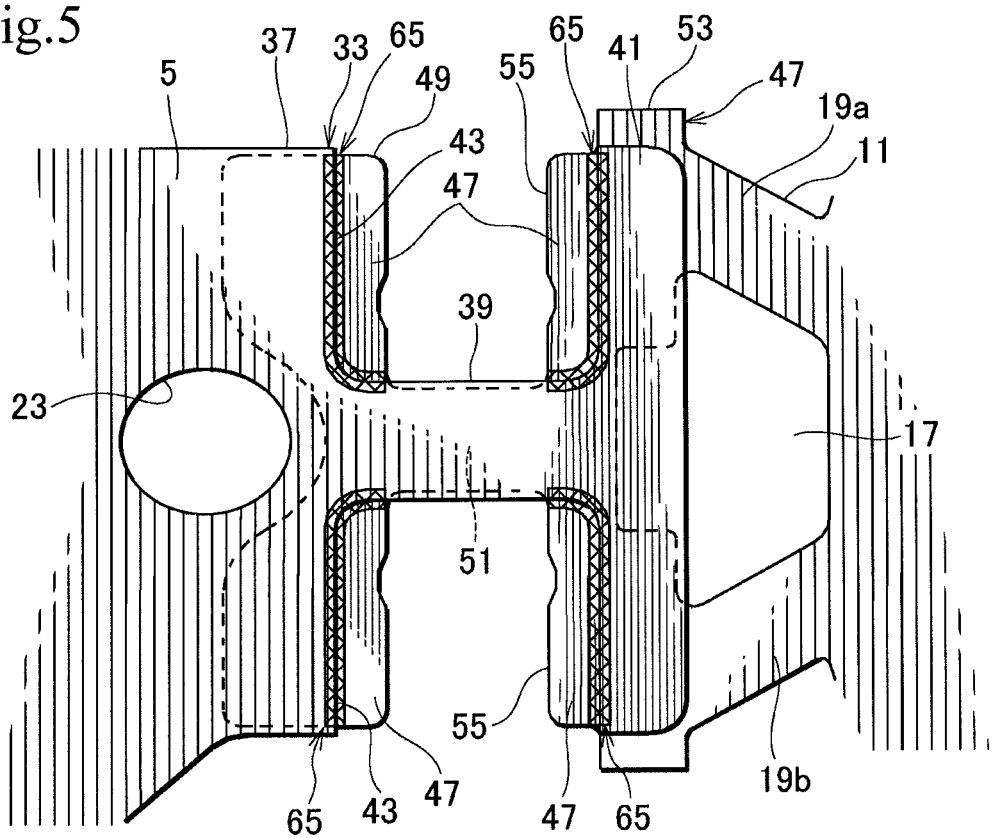
FIG. 5 is a partial plan view illustrating a suppressing zone of the piezoelectric actuator of FIG. 4.
Figure 6:
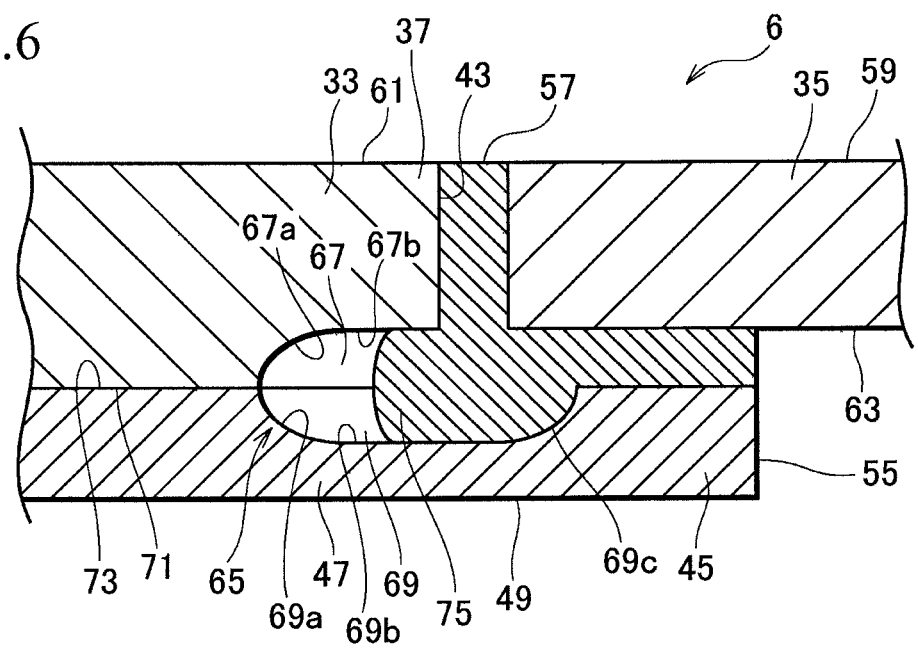
FIG. 6 is a sectional view taken along a line VI-VI of FIG. 4 illustrating the suppressing zone.
Figure 7:
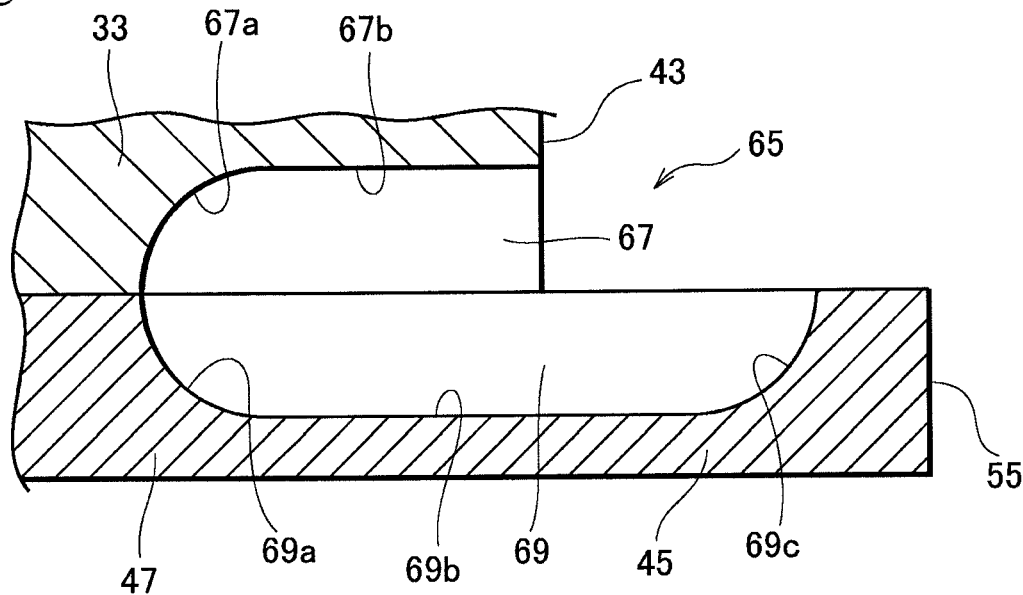
FIG. 7 is a sectional view illustrating the suppressing zone of FIG. 6.

The piezoelectric actuator 6 will be explained in detail with also reference to FIGS. 3-7. FIG. 3 is an exploded view illustrating the base plate 5 and load beam 3 of the head suspension 1, FIG. 4 is a partial plan view illustrating the piezoelectric actuator 6, FIG. 5 is a partial plan view illustrating a suppressing zone 65 of the piezoelectric actuator 6, FIG. 6 is a sectional view taken along a line VI-VI of FIG. 4 illustrating the suppressing zone 65, and FIG. 7 is a sectional view illustrating the suppressing zone 65 of FIG. 6.

As illustrated in FIGS. 1-7, the piezoelectric actuator 6 includes an actuator base 33 and a pair of piezoelectric elements 35 and is arranged between the base plate 5 and the load beam 3 of the head suspension 1. When a voltage is applied to the piezoelectric elements 35, the piezoelectric elements 35 deform to displace the load beam 3, thereby minutely moving the head 8 relative to the base plate 5 in a sway direction (a width direction of the load beam 3).

The actuator base 33 is integral with a front end of the base plate 5. The actuator base 33 may separately be formed from the base plate 5 and may be fixed to the base plate 5 by, for example, laser welding.

The actuator base 33 includes a base rear 37, a base middle 39, and a base front 41. The base rear 37 is integral with the base plate 5. The base middle 39 is at the center of the width of the actuator base 33 and extends in a longitudinal direction of the load beam 3 or piezoelectric actuator 6. The base middle 39 integrally connects the base rear 37 to the base front 41. The base front 41 extends in a width-wise direction of the electric actuator 6 so as to face the base rear 37.

On each side of the base middle 39, openings 43 are formed. Each opening 43 has a rectangular shape, is formed through the actuator base 33, is open to a side of the actuator base 33, and is provided with a receiver 45.

The receiver 45 is made of a receiver member 47 that is prepared or formed separately from the actuator base 33. According to the embodiment, the receiver member 47 is integral with a base end of the resilient part 11 of the load beam 3. The receiver member 47 may be prepared or formed separately from the resilient part 11 and may be fixed to the resilient part 11 by, for example, laser welding.

The receiver member 47 is laid on the actuator base 33 and is fixed thereto at proper locations by, for example, laser welding. With the receiver member 47 fixed to the actuator base 33, the load beam 3 is supported by the base plate 5 through the piezoelectric actuator 6.

The shape of the receiver member 47 corresponds to the shape of the actuator base 33. The receiver member 47 has a member rear 49 corresponding to the base rear 37, a member middle 51 corresponding to the base middle 39, a member front 53 corresponding to the base front 41, and holes 55 corresponding to the openings 43.

Each hole 55 is shorter in the longitudinal direction of the piezoelectric actuator 6 than the opening 43. Along each opposing side of the hole 55 of the receiver member 47, a part of the member rear 49 and a part of the member front 53 face the opening 43, to provide the opening 43 with the receiver 45.

Namely, the receiver member 47 is laid on the actuator base 33, to form the receiver 45 that faces the openings 43 and supports the piezoelectric elements 35.

The member middle 51 of the receiver member 47 is narrower than the base middle 39 of the actuator base 33, and therefore, is completely covered by the base middle 39.

As illustrated in FIGS. 1 and 4, each piezoelectric element 35 is received in and attached to the opening 43 of the actuator base 33 with an adhesive part 57.

The piezoelectric element 35 is made of piezoelectric ceramics such as PZT (lead zirconate titanate) and deforms in response to a voltage applied thereto. The piezoelectric element 35 has a rectangular shape that is slightly smaller than the shape of the opening 43 of the actuator base 33.

A first face 59 of the piezoelectric element 35 is substantially flush with a first face 61 of the actuator base 33 and is electrically connected to the first face 61 with, for example, conductive resin.

The piezoelectric element 35 has a second face 63 whose periphery faces the receiver 45 and is supported thereby. Part of the second face 63 except the periphery thereof is exposed through the hole 55 to the outside. The exposed part is connected through, for example, a bonding wire to the wiring 27 of the flexure 7. Through the first and second faces 59 and 63, voltage is applicable to the piezoelectric element 35.

As illustrated in FIGS. 1, 4 and 6, the adhesive part 57 is made of a nonconductive liquid adhesive that is filled and solidified in a space between the piezoelectric element 35 and the inner circumference of the opening 43, i.e., spaces between the piezoelectric element 35 and the base front 41 and base rear 37, as well as a space between the piezoelectric element 35 and the receiver 45. When solidified, the adhesive part 57 adheres the piezoelectric element 35 to the inner circumference of the opening 43 and the receiver 45 and secures electrical insulation between them.

The liquid adhesive may be a known nonconductive liquid adhesive. According to the first embodiment, the liquid adhesive is a base liquid adhesive containing hardening particles. The base liquid adhesive and hardening particles react and solidify when heated.

As illustrated in FIGS. 5 to 7, the piezoelectric actuator 6 has the suppressing zone 65 along an overlapping area where the actuator base 33 and receiver member 47 overlap each other.

The suppressing zone 65 is formed at least along an edge of the overlapping area that is in contact with the adhesive part 57. According to the first embodiment, the suppressing zone 65 is formed over the edge of the overlapping area and along the receiver 45 of the opening 43. The suppressing zone 65 is made of recesses 67 and 69.

The recess 67 is formed by partially etching off an overlapping face 71 of the actuator base 33 and the recess 69 is formed by partially etching off an overlapping face 73 of the receiver member 47. Namely, the recess 67 is formed in a thickness direction of the overlapping face 71 of the actuator base 33 and the recess 69 is formed in a thickness direction of the overlapping face 73 of the receiver member 47.

Each of the recesses 67 and 69 radially extends with respect to the piezoelectric element 35 in an in-plane direction. A first side of the recess 67 of the actuator base 33 is positioned at an edge of the actuator base 33 and communicates with the opening 43, and a second side thereof is positioned opposite to the opening 43.

The second side of the recess 67 opposite to the opening 43 has an arc face 67a that gradually deepens from the overlapping face 71 of the actuator base 33 toward the first side and continues to a flat bottom face 67b of the recess 67.

A first side of the recess 69 of the receiver member 47 is positioned on the receiver 45 of the opening 43 and faces the second face 63 of the piezoelectric element 35. A second side of the recess 69 corresponds to the second side of the recess 67.

The first side of the recess 69 has an arc face 69c and the second side thereof has an arc face 69a. The arc faces 69a and 69c are each similar to the arc face 67a of the second side of the recess 67. That is, the arc face 69a gradually deepens from the overlapping face 73 of the receiver member 47 toward the first side of the recess 69. The arc face 69c gradually deepens from the surface of the receiver 45 toward the second side of the recess 69. The arc faces 69a and 69c continue to a flat bottom face 69b of the recess 69.

The depths of the recesses 67 and 69 are set to widen a gap between the actuator base 33 and the receiver member 47 in the overlapping area to an extent that may not cause a capillary phenomenon of the liquid adhesive. In practice, the depths of the recesses 67 and 69 are determined in consideration of the viscosity, hardening time, and the like of the liquid adhesive. Also, the depths of the recesses 67 and 69 are determined so that the capillary phenomenon of the liquid adhesive may not occur due to one or both of the depths.

According to the first embodiment, the depth of each of the recesses 67 and 69 is set to be larger than the diameter of the hardening particle contained in the liquid adhesive. With this, no capillary phenomenon of the liquid adhesive occurs in the recesses 67 and 69 and the base adhesive and hardening particles of the liquid adhesive enter the recesses 67 and 69.

The suppressing zone 65 formed at the overlapping area of the actuator base 33 and receiver member 47 suppresses penetration of the liquid adhesive due to a capillary phenomenon into the overlapping area.

Assembling the piezoelectric actuator 6 will be explained. The actuator base 33 and receiver member 47 on which the recesses 67 and 69 are formed in advance are laid one on another and are fixed to each other at predetermined positions.

As illustrated in FIGS. 2 and 6, a liquid adhesive is applied to the base front 41, base rear 37, and receiver 45 in each opening 43. The piezoelectric element 35 is set at a predetermined position in each opening 43. It is preferable that the liquid adhesive is mixed with nonconductive small fillers for positioning the piezoelectric elements 35.

At this time, the recesses 67 and 69 of the suppressing zone 65 at the overlapping area of the actuator base 33 and receiver member 47 in contact with the liquid adhesive are sufficiently wide to suppress penetration of the liquid adhesive due to a capillary phenomenon into the overlapping area.

Excessive part of the liquid adhesive radially enters the recesses 67 and 69 of the suppressing zone 65. Since the recesses 67 and 69 have a depth larger than the diameter of the hardening particle contained in the liquid adhesive, the base adhesive and hardening particles of the liquid adhesive are allowed to enter the recesses 67 and 69.

Thereafter, the head suspension 1 with the piezoelectric actuator 6 is heat-treated at a predetermined temperature for a predetermined time with the use of, for example, an electric furnace. Due to the heat treatment, the base liquid adhesive reacts with the hardening particles, to form the adhesive part 57.

The adhesive part 57 fixes the piezoelectric element 35 to the inner circumference of the opening 43 and the receiver 45. This completes the assembling of the piezoelectric actuator 6.

The heat treatment mentioned above also hardens the liquid adhesive entered the recesses 67 and 69 of the suppressing zone 65, to form an adhesive protrusion 75 of the adhesive part 57. The adhesive protrusion 75 is equally formed, depending on the shape of the suppressing zone 65, on each of the sides of the piezoelectric element 35 that are opposite to each other in the longitudinal direction. The equally-formed adhesive protrusions 75 will not affect the dynamic characteristics such as resonance and windage characteristics of the head suspension 1.

Effect of the first embodiment will be explained. As mentioned above, the piezoelectric actuator 6 according to the first embodiment includes the actuator base 33 supporting the load beam 3 and having the opening 43 that accommodates the piezoelectric element 35, the receiver member 47 laid on and fixed to the actuator base 33 and forming the receiver 45 that faces the opening 43 and receives the piezoelectric element 35, the adhesive part 57 formed of a liquid adhesive that is filled in a space defined by the piezoelectric element 35, an inner circumference of the opening 43, and the receiver 45 and adheres the piezoelectric element 35 to the inner circumference of the opening 43 and the receiver 45, and the suppressing zone 65 formed along an overlapping area where the actuator base 33 and receiver member 47 overlap each other and suppresses penetration of the liquid adhesive due to a capillary phenomenon into the overlapping area.

The suppressing zone 65 of the piezoelectric actuator 6 suppresses penetration of the liquid adhesive due to a capillary phenomenon into the overlapping area of the actuator base 33 and receiver member 47.

By suppressing penetration of the liquid adhesive into the overlapping area, the first embodiment secures the dynamic characteristics such as resonance and windage characteristics of the head suspension I.

Each suppressing zone 65 is formed at least along an edge of the overlapping area that is in contact with the adhesive part 57, to surely suppress penetration of the liquid adhesive due to a capillary phenomenon.

The suppressing zone 65 includes the recesses 67 and 69 that are formed on the actuator base 33 and receiver member 47, respectively, to expand a space between the actuator base 33 and the receiver member 47 along the overlapping area and easily and surely suppress penetration of the liquid adhesive due to a capillary phenomenon.

The suppressing zone 65 is formed along the receiver 45 that is present on each of the sides of the opening 43 that face each other in the longitudinal direction of the piezoelectric actuator 6. The depths of the recesses 67 and 69 are set to be larger than the diameter of the hardening particle contained in the liquid adhesive. Accordingly, the liquid adhesive entered the recesses 67 and 69 also solidifies and the solidified adhesive is nearly equal on each of the sides of the piezoelectric element 35 that are opposite to each other in the longitudinal direction. As a result, the liquid adhesive entered the recesses 67 and 69 never affects the dynamic characteristics such as resonance and windage characteristics of the head suspension 1.

The head suspension 1 provided with the piezoelectric actuator 6 according to the first embodiment secures a positioning accuracy of the head 8 because the liquid adhesive entered the suppressing zone 65 does not affect the dynamic characteristics such as resonance and windage characteristics of the head suspension I.

A second embodiment of the present invention will be explained with reference to FIG. 8.

Figure 8:
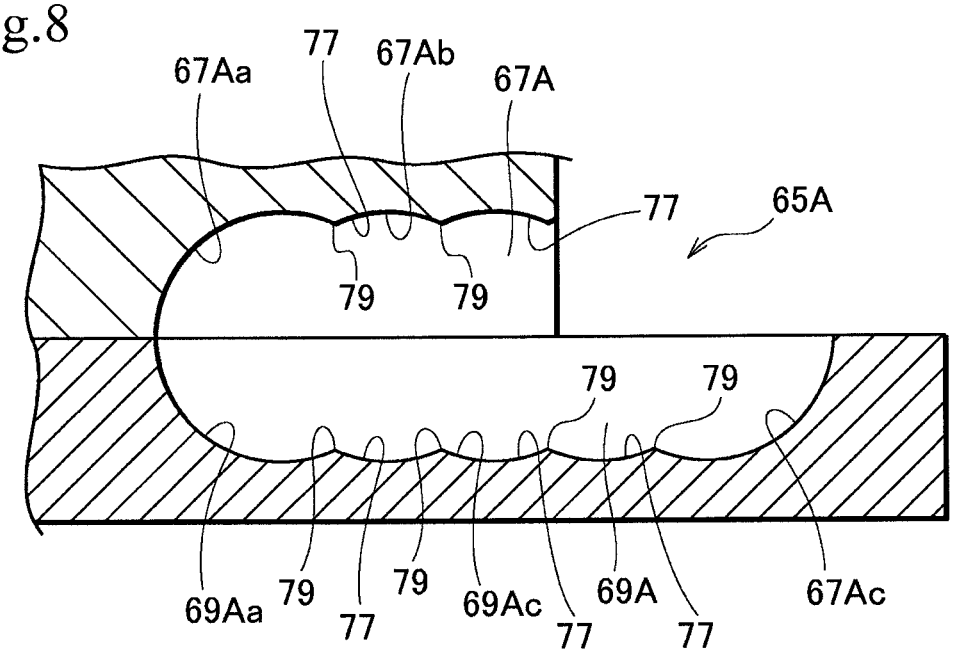
FIG. 8 is a sectional view illustrating a suppressing zone of a piezoelectric actuator according to a second embodiment of the present invention.

FIG. 8 is a sectional view illustrating a suppressing zone of a piezoelectric actuator according to the second embodiment of the present invention. The second embodiment is basically the same as the first embodiment, and therefore, corresponding parts are represented with the same reference marks, or the same reference marks plus "A" to omit a repetition of explanation.

The second embodiment differs from the first embodiment in that the second embodiment forms each suppressing zone 65A with recesses 67A and 69A whose sectional shapes are different from those of the recesses 67 and 69 of the first embodiment. Namely, the recesses 67A and 69A according to the second embodiment have concavo-convex bottom faces 67Ab and 69Ab, respectively. The bottom face 67Ab (69Ab) includes a plurality of arc concaves 77 that are consecutive. Between the adjacent concaves 77, there is a ridge 79.

The second embodiment provides effect similar to that provided by the first embodiment. In addition, the concavo-convex bottom faces 67Ab and 69Ab having the concaves 77 and ridges 79 suppress penetration of a liquid adhesive into the suppressing zone 65A.

The concavo-convex bottom faces 67Ab and 69Ab according to the second embodiment may be formed selectively on one of the recesses 67A and 69A. In this case, the other recess is provided with the flat bottom face 67b (69b) of the first embodiment.

A third embodiment of the present invention will be explained with reference to FIGS. 9A and 9B.

Figure 9A:
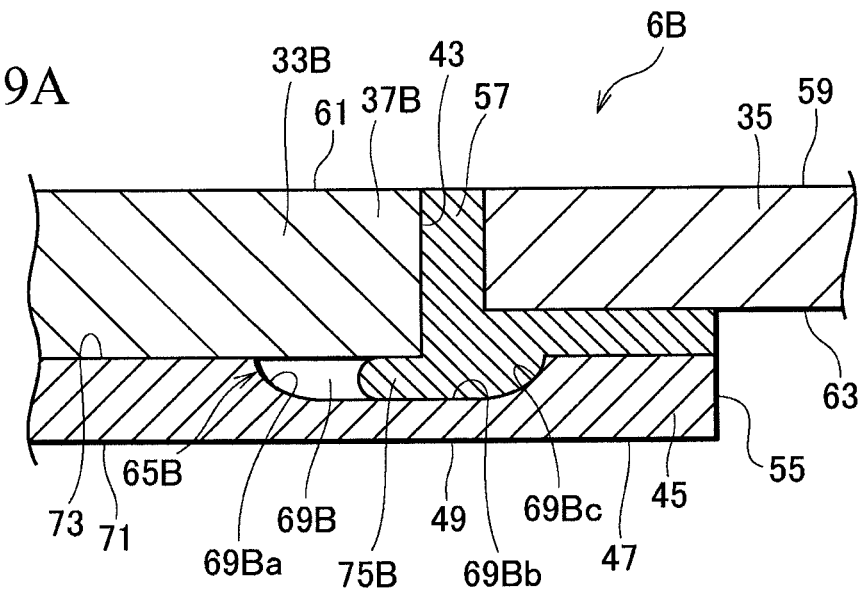
FIGS. 9A and 9B are sectional views illustrating examples of a suppressing zone of a piezoelectric actuator according to a third embodiment of the present invention.
Figure 9B:
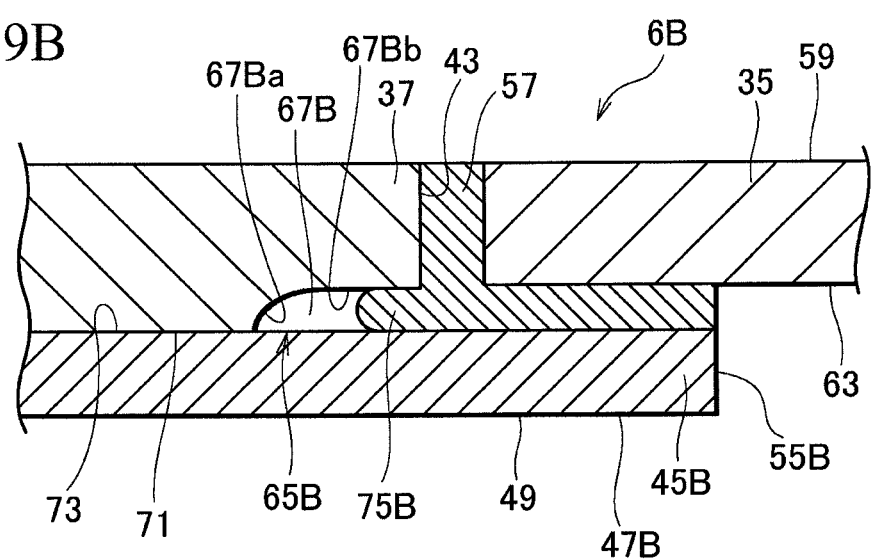

FIGS. 9A and 9B are sectional views illustrating examples of a suppressing zone of a piezoelectric actuator according to the third embodiment of the present invention, in which the example of FIG. 9A forms a recess 69B of the suppressing zone 65B on a receiver member 47B and the example of FIG. 9B forms a recess 67B of the suppressing zone 65B on an actuator base 33B. The third embodiment is basically the same as the first embodiment, and therefore, corresponding parts are represented with the same reference marks, or the same reference marks plus "B" to omit a repetition of explanation.

Unlike the first embodiment, the third embodiment forms only one of the recesses 67B and 69B for each suppressing zone 65B. The shapes of the recesses 67B and 69B are the same as those of the recesses 67 and 69 of the first embodiment. Bottom faces 67Bb and 69Bb of the recesses 67B and 69B may have any one of the bottom shapes of the first and second embodiments.

The third embodiment provides effect similar to that provided by the first embodiment.

A fourth embodiment of the present invention will be explained with reference to FIGS. 10-12.

Figure 10:
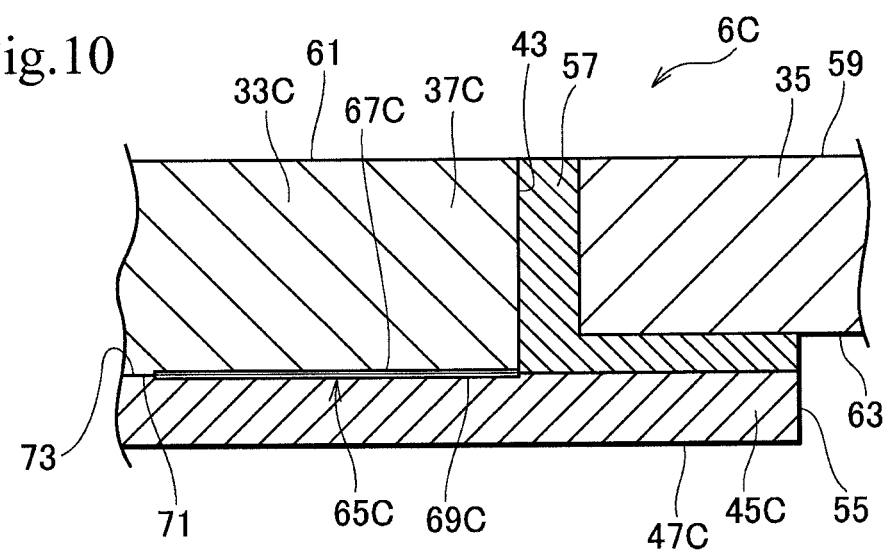
FIG. 10 is a sectional view illustrating a suppressing zone of a piezoelectric actuator according to a fourth embodiment of the present invention.
Figure 11:
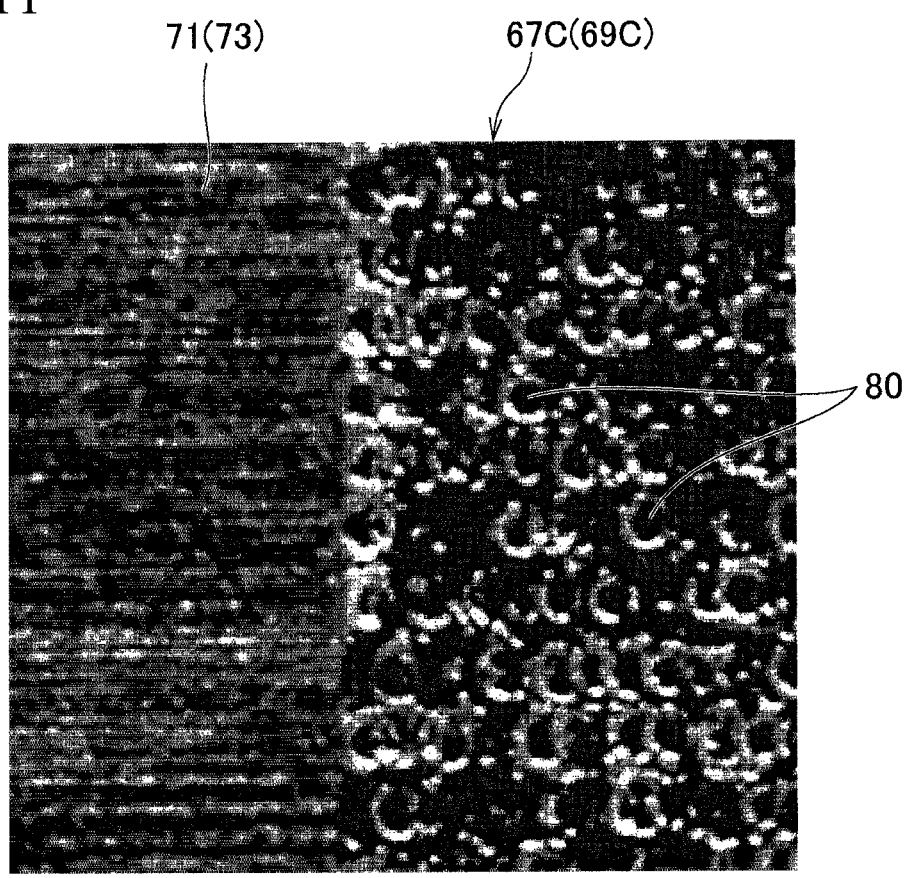
FIG. 11 is an enlarged plan view illustrating part of the suppressing zone of FIG. 10.
Figure 12:
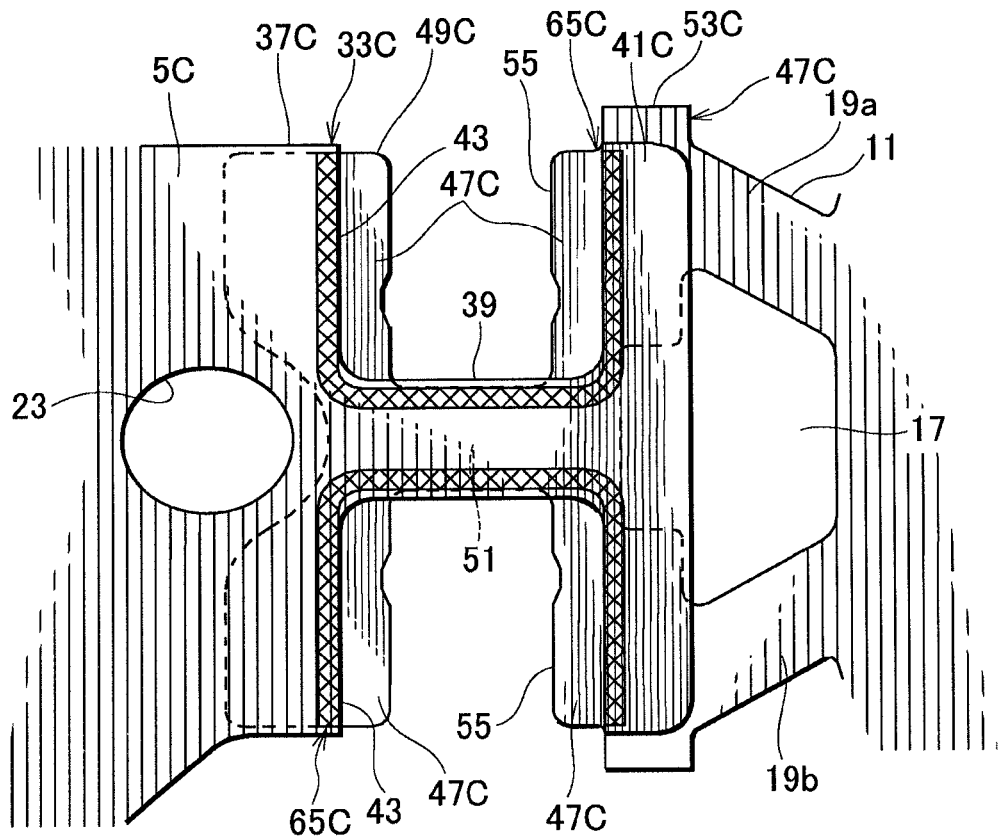
FIG. 12 is a partial plan view illustrating the suppressing zone of FIG. 10.

FIG. 10 is a sectional view illustrating a suppressing zone of a piezoelectric actuator according to the fourth embodiment of the present invention, FIG. 11 is an enlarged plan view illustrating part of the suppressing zone of FIG. 10, and FIG. 12 is a partial plan view illustrating the suppressing zone of FIG. 10, in particular, the position of the suppressing zone with respect to an actuator base of the piezoelectric actuator and a receiver member. The fourth embodiment is basically the same as the first embodiment, and therefore, corresponding parts are represented with the same reference marks, or the same reference marks plus "C" to omit a repetition of explanation.

The fourth embodiment forms recesses 67C and 69C of each suppressing zone 65C by laser processing as illustrated in FIGS. 10 and 11.

Namely, the recesses 67C and 69C are each an aggregation of very small recesses 80. Accordingly, the surfaces of the recesses 67C and 69C are rougher than overlapping faces 71 and 73 of the actuator base 33C and receiver member 47C.

The suppressing zone 65C may have at least one of the recesses 67C and 69C. Like the third embodiment, the suppressing zone 65C may have only one of the recesses 67C and 69C.

As illustrated in FIG. 12, each suppressing zone 65C is formed along an edge of an overlapping area of the actuator base 33C and receiver member 47C and along an opening 43. The suppressing zone 65C radially and outwardly extends with respect to the opening 43. The suppressing zone 65C extending along the edge of the overlapping area is in contact with an adhesive part 57 and is not present on a receiver 45C where the adhesive part 57 is formed.

According to the fourth embodiment, the recesses 67C and 69C of the suppressing zone 65C reduce the wettability of the overlapping area of the actuator base 33C and receiver member 47C.

The fourth embodiment prevents penetration of a liquid adhesive due to a capillary phenomenon into the overlapping area of the actuator base 33C and receiver member 47C and provides effect similar to that provided by the first embodiment.

A fifth embodiment of the present invention will be explained with reference to FIG. 13.

Figure 13:
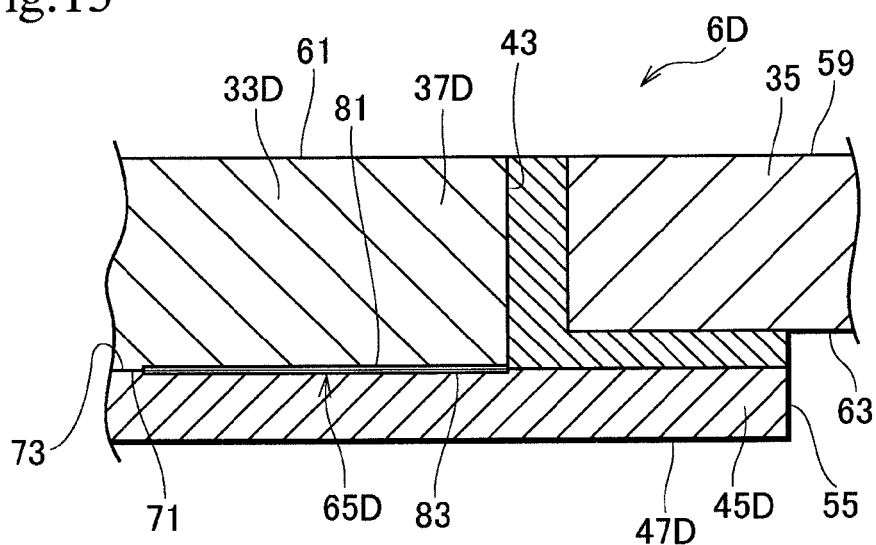
FIG. 13 is a sectional view illustrating a suppressing zone of a piezoelectric element according to a fifth embodiment of the present invention.

FIG. 13 is a sectional view illustrating a suppressing zone of a piezoelectric actuator according to the fifth embodiment of the present invention. The fifth embodiment is basically the same as the fourth embodiment, and therefore, corresponding parts are represented with the same reference marks, or the same reference arks plus "D" instead of "C" to omit a repetition of explanation.

The fifth embodiment forms water repellent parts 81 and 83 on overlapping faces 71D and 73D of an actuator base 33D and a receiver member 47D, respectively, thereby forming a suppressing zone 65D.

The water repellent parts 81 and 83 are formed by processing the overlapping faces 71D and 73D with, for example, fluorine. The position of each suppressing zone 65D is the same as that of the fourth embodiment. The suppressing zone 65D may have at least one of the water repellent parts 81 and 83. Like the third embodiment, the suppressing zone 65D may have only one of the water repellent parts 81 and 83.

According to the fifth embodiment, the water repellent parts 81 and 83 of the suppressing zone 65D reduce the wettability of the overlapping area of the actuator base 33D and receiver member 47D, like the fourth embodiment.

The present invention is not limited to the embodiments mentioned above.

Although the piezoelectric actuator 6 employs a pair of piezoelectric elements 35 according to the embodiments, the present invention is also applicable to a piezoelectric actuator employing a single piezoelectric element.

According to the embodiments, the suppressing zone is formed along an edge of the overlapping area of the actuator base and receiver member in contact with the adhesive part. It is possible to form the suppressing zone all over the overlapping area.

According to the embodiments, the suppressing zone is formed at least along an edge of the overlapping area adjacent to the opening 43. The suppressing zone may be formed at a location shifted from the edge of the overlapping area in a direction away from the opening 43. The amount of the shift must be set so that a liquid adhesive penetrating the overlapping area never affects the dynamic characteristics of the head suspension.

What is claimed is:

1. A piezoelectric actuator having a piezoelectric element that deforms according to a voltage applied thereto and thereby displaces an object the piezoelectric actuator supports, the piezoelectric actuator comprising:
    an actuator base supporting the object and having an opening that accommodates the piezoelectric element;
    a receiver member laid on and fixed to the actuator base and forming a receiver that faces the opening and receives the piezoelectric element;
    an adhesive part formed of a liquid adhesive that is filled in a space defined by the piezoelectric element, an inner circumference of the opening, and the receiver and adheres the piezoelectric element to the inner circumference of the opening and the receiver; and
    a suppressing zone formed along an overlapping area where the actuator base and receiver member overlap each other and suppresses penetration of the liquid adhesive due to a capillary phenomenon into the overlapping area; and
    wherein the suppressing zone is a recess formed on at least one of the actuator base and receiver member.

2. The piezoelectric actuator of claim 1, wherein the recess has a bottom face that is one of a flat face and a concavo-convex face.

3. The piezoelectric actuator of claim 1, wherein the liquid adhesive includes a liquid base adhesive and hardening particles mixed with the liquid base adhesive, the receiver is formed along each of lateral sides of the opening, the lateral sides opposing each other in a longitudinal direction of the piezoelectric actuator, the suppressing zone is formed along the receiver, and the depth of the recess of the suppressing zone is larger than the diameter of the hardening particle.

4. The piezoelectric actuator of claim 1, wherein the recess is formed by one of laser processing and etching.

5. The piezoelectric actuator of claim 1, wherein the suppressing zone is formed along an edge of a contact area where the overlapping area is in contact with the adhesive part.

6. A head suspension including the piezoelectric actuator of claim 1, comprising;
    a base, a load beam connected to the base and a read/write head supported with the load beam; and
    the piezoelectric actuator being arranged between the base and the load beam, and according to the deformation of the piezoelectric element, minutely moving the read/write head through the load beam in a sway direction.

* * * * *